United States Patent
Posseme et al.

(10) Patent No.: US 10,381,264 B2
(45) Date of Patent: Aug. 13, 2019

(54) PROCESS FOR PRODUCING CONNECTIONS TO AN ELECTRONIC CHIP

(71) Applicant: Commissariat à l'Énergie Atomique et aux Énergies Alternatives, Paris (FR)

(72) Inventors: Nicolas Posseme, Sassenage (FR); Yann Mazel, Lyons (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/075,530

(22) PCT Filed: Feb. 3, 2017

(86) PCT No.: PCT/FR2017/050260
§ 371 (c)(1),
(2) Date: Aug. 3, 2018

(87) PCT Pub. No.: WO2017/137682
PCT Pub. Date: Aug. 17, 2017

(65) Prior Publication Data
US 2019/0043755 A1 Feb. 7, 2019

(30) Foreign Application Priority Data
Feb. 9, 2016 (FR) ..................................... 16 50994

(51) Int. Cl.
*H01L 21/768* (2006.01)
*H01L 21/02* (2006.01)
*H01L 21/311* (2006.01)

(52) U.S. Cl.
CPC .. *H01L 21/76814* (2013.01); *H01L 21/02063* (2013.01); *H01L 21/31116* (2013.01); *H01L 21/31144* (2013.01); *H01L 21/76829* (2013.01)

(58) Field of Classification Search
None
See application file for complete search history.

(56) References Cited

U.S. PATENT DOCUMENTS

2008/0121619 A1 5/2008 Lin et al.
2008/0146036 A1 6/2008 Lai et al.
(Continued)

FOREIGN PATENT DOCUMENTS

FR  2941560 A1  7/2010

OTHER PUBLICATIONS

Written Opinion of the International Searching Authority dated May 19, 2017 in connection with International Application No. PCT/FR2017/050260.

(Continued)

*Primary Examiner* — Angel Roman
(74) *Attorney, Agent, or Firm* — Wolf, Greenfield & Sacks, P.C.

(57) ABSTRACT

A process for producing conductive connections to an electronic chip, comprising the following steps: a) depositing an insulating layer on one face of a wafer; b) producing a layer based on at least one metal covering the insulating layer and equipped with first apertures; c) etching second apertures in the insulating layer in the extension of the first apertures by plasma etching in a plasma based on at least one halogen-containing compound; d) vacuum annealing the entire structure obtained after step c); and e) forming, after step d), the conductive connections in the second apertures.

12 Claims, 3 Drawing Sheets

(56) References Cited

U.S. PATENT DOCUMENTS

2011/0053371 A1   3/2011  Liu et al.
2017/0084542 A1*  3/2017  Kato ................. H01L 23/53238

OTHER PUBLICATIONS

International Search Report dated May 19, 2017 in connection with Application No. PCT/FR2017/050260.
Posseme et al., Etching of porous SiOCH materials in fluorocarbon. J. Vac. Sci. Technol. B, vol. 22, No. 6, Nov./Dec. 2004, p. 2772-2784.
Posseme et al., Residue growth on metallic-hard mask after dielectric etching in fluorocarbon-based plasmas. I. Mechanisms. J. Vac. Sci. Technol. B 28(4), Jul./Aug. 2010. p. 809-816.
Posseme et al., Residue growth on metallic hard mask after dielectric etching in fluorocarbon based plasmas. II. Solutions. J. Vac. Sci. Technol. B, vol. 29, No. 1, Jan./Feb. 2011. p. 011018-1-011018-10.

* cited by examiner

PROCESS FOR PRODUCING CONNECTIONS TO AN ELECTRONIC CHIP

This application is a national stage filing under 35 U.S.C. 371 of International Patent Application Serial No. PCT/FR2017/050260, filed Feb. 3, 2017, which claims priority to French patent application FR16/50994, filed on Feb. 9, 2016. The entire contents of these applications are incorporated herein by reference in their entirety.

BACKGROUND

The present application concerns the manufacturing of electronic chips, and in particular a method of forming conductive connections between elements of an electronic chip.

DISCUSSION OF THE RELATED ART

An electronic chip comprises electronic circuits formed inside and on top of a semiconductor wafer. In such electronic circuits, elementary components such as transistors, diodes, capacitors, etc. are interconnected by conductive connections.

On manufacturing of the chip, the elementary components are formed first. Such elementary components are provided with contacts located on a surface of the wafer. The connections are formed afterwards. Such connections are coupled to the elementary components via the contacts and are separated from one another by an electrically insulating material.

N. Posseme et al.'s article, entitled "Residue growth on metallic hard mask after dielectric etching in fluorocarbon based plasmas. II. Solutions" (J. Vac. Sci. Technol. B 29 (1), January/February 2011), describes a method of forming connections separated by insulating materials. In this method, the insulating materials are etched through a mask. To remove the mask without deteriorating the insulating materials used in the method, the mask is made up of metals.

More generally, masks made up of metals are used to etch an insulating material in known connection forming methods. After the etching, corpuscles or aggregates may appear on the mask and in the etched areas. Such aggregates cause defects which compromise the reliability of known methods.

There thus is a need for a method enabling to implement a mask made up of metals to form connections separated by insulating materials.

SUMMARY

Thus, an object of an embodiment is to overcome all or part of the above-described disadvantages.

An object of an embodiment is to form connections while enabling the use of a mask made up of metals to etch an insulating material, while limiting the forming of aggregates after the etch step.

Thus, an embodiment provides a method of forming conductive connections of an electronic chip, comprising the successive steps of: a) depositing an insulating layer on a surface of a wafer; b) forming a layer made up of at least one metal covering the insulating layer and provided with first openings; c) etching second openings in the insulating layer in line with the first openings by etching with a plasma based on at least one halogenated compound; d) exposing the assembly formed by the structure obtained after step c) to oxygen, to a mixture of hydrogen and nitrogen, or to a mixture of methane and nitrogen; e) annealing in vacuum said assembly; and f) forming, after step d), the conductive connections in the second openings.

According to an embodiment, at step d), the pressure is greater than 1.3 Pa.

According to an embodiment, the duration of step d) is longer than 5 s.

According to an embodiment, at step e), said assembly is annealed at a temperature higher than 100° C.

According to an embodiment, at step e), said assembly is annealed under a pressure smaller than 300 Pa.

According to an embodiment, at step e), said assembly is annealed in the presence of gas comprising hydrogen and/or inert gases.

According to an embodiment, at step e), said assembly is annealed for a duration in the range from 1 min to 10 min.

According to an embodiment, the halogenated compound is a fluorinated compound and the layer made up of at least one metal is a layer comprising at least 50% by mass of titanium.

According to an embodiment, the insulating layer is a SiOCH layer and at step e), said assembly is annealed at a temperature lower than 300° C.

According to an embodiment, the SiOCH layer is porous and has a porosity in the range from 20% to 50%.

According to an embodiment, the insulating layer is made of silicon oxide.

According to an embodiment, steps c), d), and e) are carried out in a same reactor.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
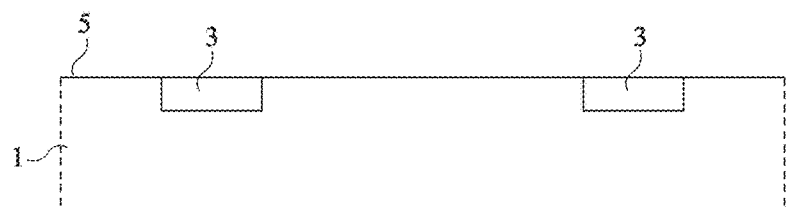
FIGS. 1A to 1F illustrate steps of a method of forming connections of a chip.

The same elements have been designated with the same reference numerals in the various drawings and, further, the various drawings are not to scale. For clarity, only those steps and elements which are useful to the understanding of the described embodiments have been shown and are detailed. In particular, the elementary components of circuits of an electronic chip are not shown.

In the following description, when reference is made to terms qualifying the relative position, such as term "top", reference is made to the orientation of the concerned element in the concerned drawings.

In the following description, term aggregate designates corpuscles having a dimension greater than 5 nm.

FIGS. 1A to 1F are simplified cross-section views illustrating steps of a method of forming conductive connections of a chip. According to an embodiment, the obtained connections are separated by insulators having a low dielectric permittivity, that is, a relative dielectric permittivity smaller than approximately 3. Such a low relative permittivity enables to avoid for electric signals transmitted by neighboring connections to disturb one another during the chip operation.

FIG. 1A shows a semiconductor wafer 1. Elementary components, not shown, are formed inside and on top of wafer 1. Such components are provided with contacts 3 arranged at the level of a surface 5 of wafer 1. Only two contacts 3 are shown. Surface 5 is planar and contacts 3 are flush with surface 5.

Figure 1B:
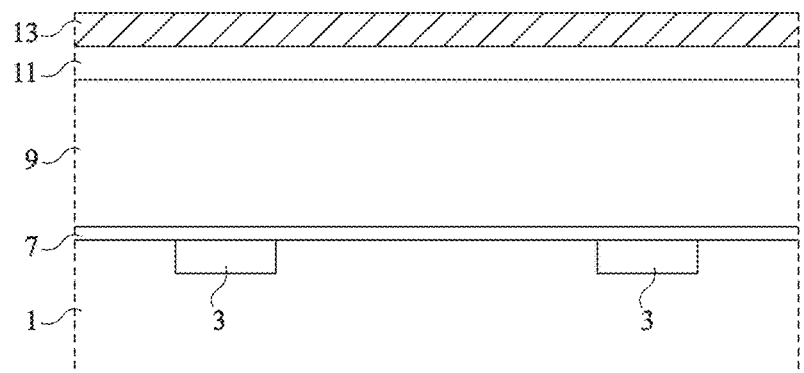

FIG. 1B illustrates a plurality of successive steps. An insulating silicon carbonitride layer 7 (SiCN) is deposited on surface 5. Then, an insulating layer 9 made of carbonated and hydrogenated silicon oxide (SiOCH) is formed on layer 7. Layer 7 is covered with a silicon oxide layer 11. Layers 7, 9 and 11 may be formed by plasma-enhanced vapor deposition. Layer 11 is then covered with a titanium nitride layer 13 (TiN).

Figure 1C:
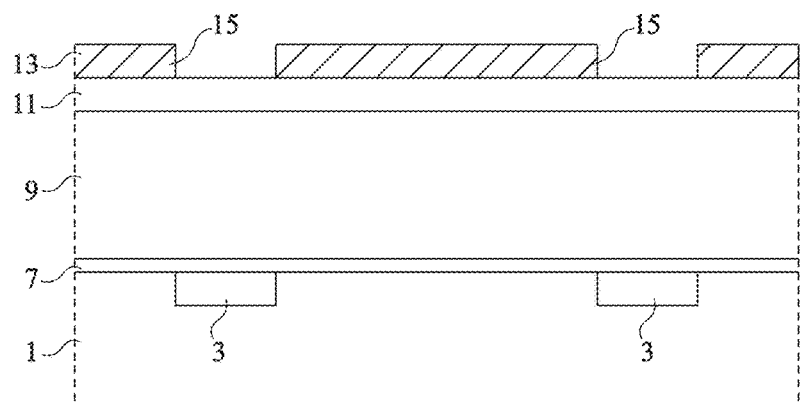

In FIG. 1C, openings 15 are etched in layer 13 above contacts 3. The etching may be performed through openings formed in a masking layer, not shown. The masking layer is then removed by etching.

Figure 1D:
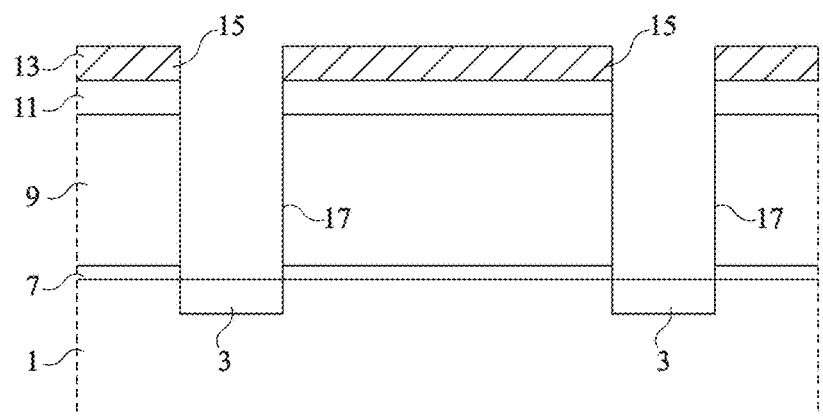

At the step illustrated in FIG. 1D, openings 17 in silicon oxide layer 11 and SiOCH layer 9 are etched by plasma in line with openings 15. The etching of layers 11 and 9 may be performed with a plasma made up of a hydrofluorocarbide, called HFC plasma hereafter, for example, a plasma made up of a fluoro-carbide such as octafluorobutane C4F8. TiN layer 13 provided with openings 15 thus forms a mask. The etching is carried out all the way to SiCN layer 7, which forms an etch stop layer. Then, the portions of layer 7 located on contacts 3 are etched. Layer 7 may be etched with a plasma made up of hydrofluoro-carbides such as carbon tetrafluoride (CF4) and fluoromethane (CH3F).

Figure 1E:
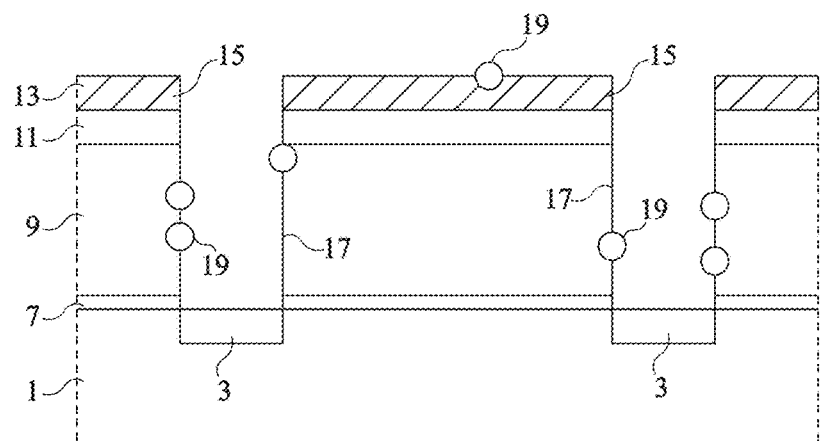

In FIG. 1E, the assembly has been stored and exposed to air until the next steps of the method are carried out. The wait may be longer than 3 hrs. Aggregates 19 appear on the walls of the etched portions and on the surface of layer 13.

Figure 1F:
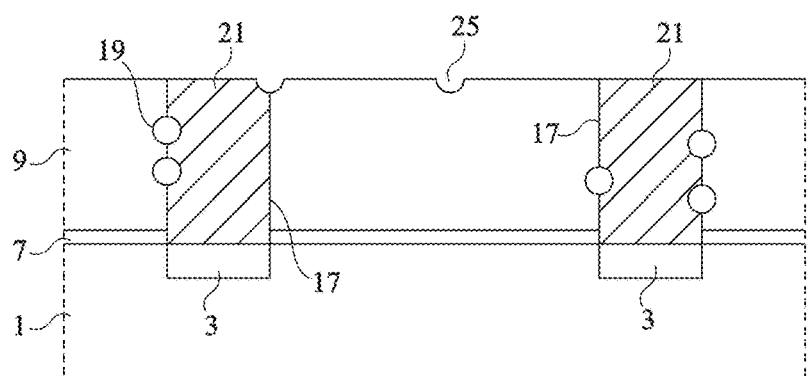

FIG. 1F illustrates a subsequent step of the method. A metal deposit, filling, in particular, openings 17, has been formed over the entire structure. Layers 13 and 11 and portions of the metal deposit have been removed by a chem.-mech. polishing. Layer 11 is used as a polishing stop layer. Portions 21 of the metal deposition remain in openings 17 and form connections coupled to contacts 3. Conductive connections 21 separated by portions of SiOCH insulating layer 9 have been obtained.

The presence of aggregates 19 causes defects. In particular, the aggregates 19 present in openings 17 may disturb the metal deposition step and alter the quality of connections 21. Further, the aggregates 19 present in the etched portions may alter the quality of insulating SiOCH layer 9 and, during the chip operation, signals transmitted by a connection 21 risk being disturbed by signals circulating through a neighboring connection 21. Further, the aggregates present on the surface of layer 13 disturb the polishing method and cause defects 25 on the wafer surface. The presence of defects may compromise the chip operation.

The inventors have demonstrated that fluorinated residues are present on the surfaces of the structure obtained after the steps of etching layers 7 and 9 with HFC plasmas. The inventors have further demonstrated that aggregates 19 originate from an interaction between the titanium of layer 13, the fluorinated residues, and the humidity of air. For example, the inventors have observed that aggregates appear at the surface of a TiN layer successively exposed to a plasma made up of C4F8 for at least 60 s and then to air for a time period longer than 2 min.

To limit the forming of aggregates, a processing step may be provided after the etch step illustrated in FIG. 1D and before the waiting step described in relation with FIG. 1E. The processing step may be a phase of exposure of the assembly to oxygen, to a mixture of hydrogen and nitrogen, or to mixture of methane and of nitrogen, the processing step being carried out before the exposure to the ambient air. The processing step may also be phase of ventilation of the assembly with dry air for some ten minutes. However, such a processing step does not enable to sufficiently decrease the number of aggregates.

Thus, the method described in relation with FIGS. 1A to 1F is unreliable.

Figure 2A:
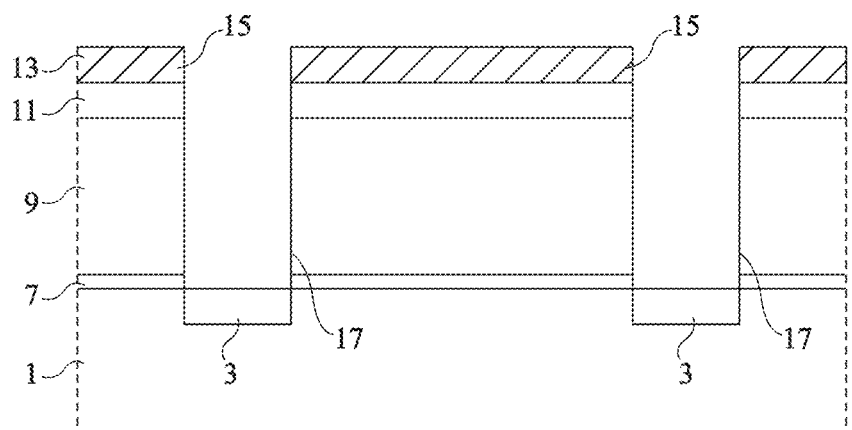
FIGS. 2A and 2B illustrate an embodiment of steps of a method of forming connections of a chip.
Figure 2B:
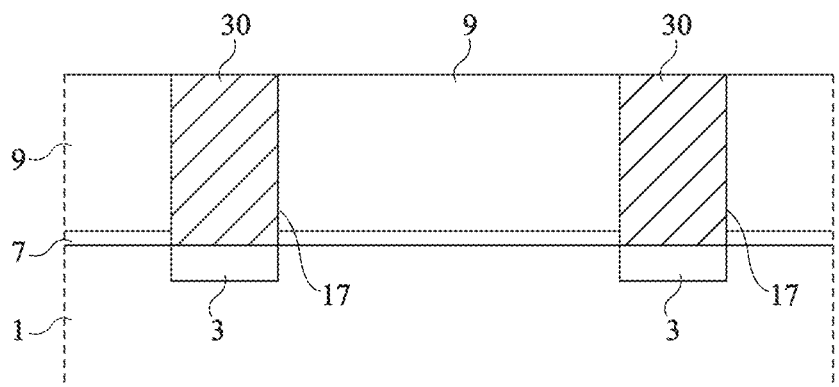

FIGS. 2A and 2B illustrate steps of an embodiment of a method of manufacturing connections of a chip.

The steps preceding the step illustrated in FIG. 2A are similar to the steps illustrated in FIGS. 1A to 1D, that is:

a) successively depositing insulating layers 7, 9, and 11 respectively made of SiCN, of SiOCH, and of silicon oxide on a surface of a wafer 1 comprising contacts 3 flush with the surface, and then depositing a TiN layer 13;

b) etching openings in TiN layer 13; and c) etching layers 11, 9, and 7 with a HFC plasma.

As an example, insulating layer 7 has a thickness in the range from 5 nm to 30 nm. Insulating layer 9 may have a thickness in the range from 30 nm to 200 nm. Oxide layer 11 may have a thickness in the range from 10 nm to 50 nm. According to an example, TiN layer 13 has a thickness in the range from 5 nm to 50 nm.

At the step illustrated in FIG. 2A, the entire structure obtained after step c) has been annealed in vacuum under a pressure smaller than 300 Pa (approximately 2 mmHg). The residual gases present during the anneal may be hydrogen or inert gases such as nitrogen, helium, or argon. The anneal takes place at a temperature greater than 100° C. The anneal temperature is lower than 300° C. to avoid damaging SiOCH insulator layer 9. The duration of the anneal may be in the range from 1 min to 10 min.

After, the assembly is exposed to ambient air during waiting and storage phases. The inventors have observed that no aggregates are formed after a phase of exposure to air which may reach 18 hrs. The fluorinated residues present on the walls seem to be partially removed by the anneal.

In a variation, an additional processing step is provided after etch step c) and before the anneal step illustrated in FIG. 2A. At this processing step, the entire structure obtained after step c) is exposed to oxygen, to a mixture of hydrogen and of nitrogen, or to a mixture of methane and of nitrogen, under a pressure greater than 1.3 Pa (approximately 10 mTorr), preferably in the range from 1.3 Pa to 6.7 Pa (between approximately 10 mTorr and approximately 50 mTorr) and for a duration longer than 5 seconds, preferably in the range from 5 s to 30 s. Other gases capable of removing fluorinated residues may be used, for example, gases containing carbon or gases capable of removing the fluorinated residues by oxidation or by reduction.

At the step illustrated in FIG. 2B, openings 17 have been filled with a conductor, such as copper or tungsten, and the surface has been polished, identically to the step described in relation with FIG. 1F.

Conductive connections 30 coupled to contacts 3 and separated by portions of SiOCH insulating layer 9 are obtained. Conductive tracks arranged on insulator 9 and coupling connections 30 may be formed at a subsequent step.

During the chip operation, electronic signals are transmitted by the tracks to connections 30. The relative dielectric permittivity of SiOCH may be smaller than 3. Thereby, a signal transmitted by a connection 30 is not disturbed by signals transmitted by neighboring connections. In a variation, the SiOCH of the insulating layer is porous and thereby has a dielectric permittivity smaller than the dielectric permittivity of non-porous SiOCH. The insulating layer made of porous SiOCH may have a porosity in the range from 20% to 50%.

Specific embodiments have been described. Various alterations and modifications will occur to those skilled in the art. In particular, although in the described embodiments, insulators have been etched by HCF plasmas, insulators may be etched by means of plasmas made up of any type of halogenated compound, for example, halogenoalkanes such as chlorofluoro-carbides or hydrochlorocarbides.

Further, although, in the described embodiments, insulating layer 9 is made of SiOCH, insulating layer 9 may be made of any other material capable of being etched by a plasma made up of a halogenated compound. As an example, insulating layer 9 is made of silicon oxide.

Further, although the temperature used during the anneal step described in relation with FIG. 2A is lower than 300° C. to avoid damaging insulating SiOCH layer 9, this temperature may have a greater value compatible with the materials used.

Further, although etch stop layer 7 is made of SiCN in embodiments, this layer may be made of any other material adapted to the plasma used. As an example, the etch stop layer may be made of silicon nitride when the plasma used is provided to etch an insulator made of silicon oxide.

Further, although a specific polishing stop layer has been described, this layer may be omitted or replaced with any other adapted layer.

Further, although, in the previously-described embodiments, a TiN mask is used, the mask may be any mask made up of at least one metal, that is, containing a proportion of metal greater than 50% by mass, particularly any mask made up of at least one metal generating aggregates after successive exposures to a halogenated plasma and then to air. As examples, the mask may be made of tantalum nitride, of aluminum oxide, or of hafnium oxide, or the mask may be metallic, for example, made of titanium or of tantalum.

Further, although specific steps have been described to form a mask made up of at least one metal, these steps may be replaced with any other method capable of forming a layer made up of at least one metal covering the insulating layer and provided with openings.

Further, although, in described embodiments, a single mask made up of at least one metal is used, the mask made up of at least one metal may be combined, for example, with masks of organic materials. As an example, a masking layer made of an organic material may be extended over the entire structure obtained after the step described in relation with FIG. 1C of etching openings in TiN layer 13. This masking layer is then etched to obtain an organic mask. The organic mask, combined with the mask made up of metals, enables to form a selected configuration of connections and of tracks coupling these connections.

Further, in the disclosed embodiment, tracks coupling connections 30 are formed after the step illustrated in FIG. 2B. In a variation, the tracks coupling connections 30 may be formed by adding, before the step illustrated in FIG. 2A, the steps of:

etching openings in layer 13 according to the track configuration; and etching from these openings layer 11 and then layer 9 across part of its thickness, where the etching may be achieved by a HFC plasma.

The tracks may then be formed at the same time as the connections during the step illustrated in FIG. 2B.

The invention claimed is:

1. A method of forming conductive connections of an electronic chip, comprising the successive steps of:
   a) depositing an insulating layer on a surface of a wafer;
   b) forming a layer made up of at least one metal covering the insulating layer and provided with first openings;
   c) etching second openings in the insulating layer in line with the first openings by etching with a plasma made up of at least one halogenated compound;
   d) exposing the assembly formed by structure obtained after step c) to oxygen, to a mixture of hydrogen and nitrogen, or to a mixture of methane and nitrogen;
   e) annealing said assembly in vacuum; and
   f) forming, after step e), the conductive connections in the second openings.

2. The method of claim 1, wherein at step d), the pressure is greater than 1.3 Pa.

3. The method of claim 1, wherein the duration of step d) is longer than 5 s.

4. The method of claim 1, wherein at step e), said assembly is annealed at a temperature higher than 100° C.

5. The method of claim 1, wherein at step e), said assembly is annealed under a pressure smaller than 300 Pa.

6. The method of claim 1, wherein at step e), said assembly is annealed in the presence of gas comprising hydrogen and/or inert gases.

7. The method of claim 1, wherein at step e), said assembly is annealed for a duration in the range from 1 min to 10 min.

8. The method of claim 1, wherein the halogenated compound is a fluorinated compound and the layer made up of at least one metal is a layer comprising at least 50% by mass of titanium.

9. The method of claim 1, wherein the insulating layer is a SiOCH layer and at step e), said assembly is annealed at a temperature lower than 300° C.

10. The method of claim 9, wherein the SiOCH layer is porous and has a porosity in the range from 20% to 50%.

11. The method of claim 1, wherein the insulating layer (9) is made of silicon oxide.

12. The method of claim 1, wherein steps c), d), and e) are carried out in a same reactor.

* * * * *

UNITED STATES PATENT AND TRADEMARK OFFICE
CERTIFICATE OF CORRECTION

PATENT NO. : 10,381,264 B2
APPLICATION NO. : 16/075530
DATED : August 13, 2019
INVENTOR(S) : Nicolas Posseme et al.

Page 1 of 1

It is certified that error appears in the above-identified patent and that said Letters Patent is hereby corrected as shown below:

On the Title Page

Item (72), Line 2, Inventors: "Yann Mazel, Lyons (FR)" should read --Yann Mazel, Lyon (FR)--.

Signed and Sealed this
First Day of October, 2019

Andrei Iancu
*Director of the United States Patent and Trademark Office*